US012638778B2

(12) United States Patent
Lee et al.

(10) Patent No.: US 12,638,778 B2
(45) Date of Patent: May 26, 2026

(54) EUV MIRROR WITH IMPROVED OPTICAL STABILITY

(71) Applicant: Taiwan Semiconductor Manufacturing Company, Hsinchu (TW)

(72) Inventors: Yung-Yao Lee, Zhubei (TW); Yi-Nong Chung, Kaohsiung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 799 days.

(21) Appl. No.: 17/866,656

(22) Filed: Jul. 18, 2022

(65) Prior Publication Data

US 2024/0019786 A1 Jan. 18, 2024

(51) Int. Cl.
| | |
|---|---|
| *G03F 7/00* | (2006.01) |
| *G02B 5/08* | (2006.01) |
| *G02B 7/18* | (2021.01) |
| *G02B 17/06* | (2006.01) |
| *G21K 1/06* | (2006.01) |
| *H01L 21/027* | (2006.01) |

(52) U.S. Cl.
CPC ......... *G03F 7/7015* (2013.01); *G02B 5/0891* (2013.01); *G02B 7/1815* (2013.01); *G02B 17/06* (2013.01); *G03F 7/70033* (2013.01); *G03F 7/7085* (2013.01); *G03F 7/70891* (2013.01); *G03F 7/7095* (2013.01); *G21K 1/067* (2013.01); *H01L 21/027* (2013.01)

(58) Field of Classification Search
CPC .................................................. G02B 7/1815
See application file for complete search history.

(56) References Cited

U.S. PATENT DOCUMENTS

| | | | |
|---|---|---|---|
| 2010/0201958 A1* | 8/2010 | Hauf et al. ............. | G03B 27/52 |
| | | | 355/30 |
| 2015/0168674 A1* | 6/2015 | Bittner et al. ........... | G02B 7/18 |
| 2016/0195818 A1* | 7/2016 | Baer et al. ............ | G03F 7/7015 |

FOREIGN PATENT DOCUMENTS

| | | | |
|---|---|---|---|
| EP | 2201435 B1 * | 2/2013 | ............... G02B 7/18 |

OTHER PUBLICATIONS

Chris A. Mack, Off-Axis Illumination, The Lithography Expert, Aug. 2003 (Year: 2003).*

(Continued)

*Primary Examiner* — Jennifer D. Carruth
(74) *Attorney, Agent, or Firm* — Lippes Mathias LLP

(57) ABSTRACT

A heated extreme ultraviolet (EUV) mirror, method of making same, and a projection optics box (POB) of an EUV lithography scanner employing same, are disclosed. The POB includes EUV mirrors disposed inside a vacuum chamber and arranged respective to project an image of a reflective EUV photolithography mask disposed on a reticle stage onto a wafer disposed on a wafer stage. Each EUV mirror of the plurality of EUV mirrors includes a mirror support and an EUV-reflective multilayer disposed on a front side of the mirror support. The plurality of EUV mirrors includes at least one heated EUV mirror that further includes a resistive heater disposed in the mirror support of the heated EUV mirror. In integrated circuit manufacturing, the exposure of a photoresist layer on a semiconductor wafer to EUV light using the POB includes controlling mirror temperature using a heater embedded in the EUV mirror.

20 Claims, 5 Drawing Sheets

(56)  References Cited

OTHER PUBLICATIONS

Van Dyke, Neil. "Eight meter fused silica mirror blank fabrication."
Very Large Telescopes and their Instrumentation, vol. 2. vol. 30.
1988 (Year: 1988).*
Introduction to Microelectronic Fabrication, Richard C. Jaeger,
Addison-Wesley Publishing Company, 1988, pp. 1-4, 16-21 (Year:
1988).*

* cited by examiner

EUV MIRROR WITH IMPROVED OPTICAL STABILITY

BACKGROUND

The following relates to the extreme ultraviolet (EUV) optical arts, EUV lithography arts, and related arts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
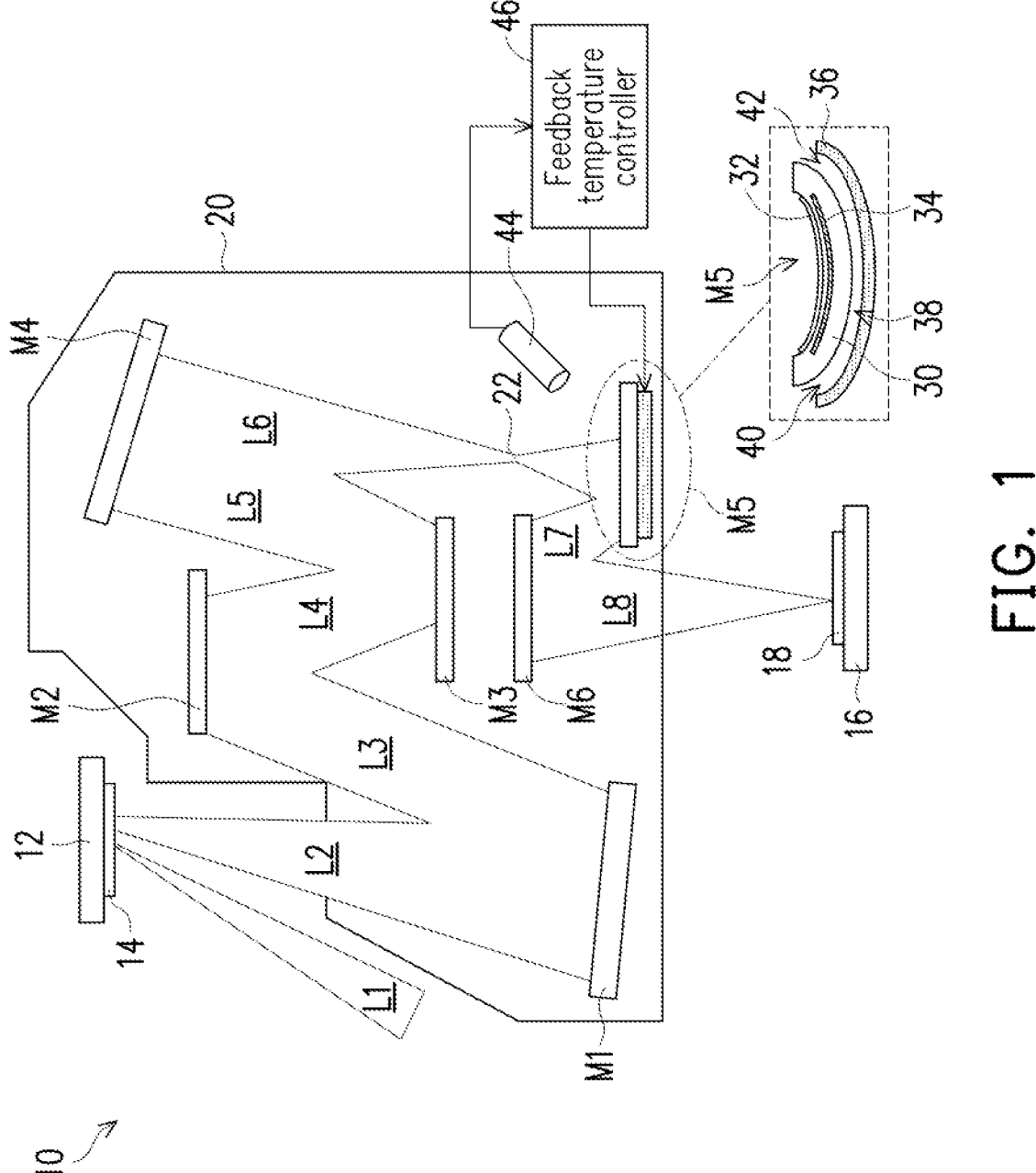
FIG. 1 diagrammatically illustrates a projection optics box (POB) of an EUV lithography scanner including an EUV-reflective mirror system as disclosed herein. Inset A of FIG. 1 diagrammatically shows a simplified side sectional view of an illustrative heated EUV-reflective mirror of an optical train of the POB.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Extreme ultraviolet (EUV) light in a range of 124 nm to 10 nm is used in photolithography processes for forming semiconductor devices with small critical dimension (CD)

values. As a nonlimiting illustrative example, an EUV lithography system employing 13.5 nm light generated by a laser-produced plasma (LPP) EUV light source employing a tin plasma is used in defining sub-10 mm node devices. EUV optics for such a system are challenging, as there are very few materials that are transmissive at EUV wavelengths. Consequently, an EUV scanner typically employs primarily or solely reflective optics, using a distributed Bragg reflector tuned for the design-basis EUV wavelength. For 13.5 nm light, a molybdenum/silicon (Mo/Si) multilayer is one suitable distributed Bragg reflector. Suitable mirror curvature may be employed to provide focusing of the EUV light. Some systems employ a step-and-shoot design in which successive field facets of a grid of field facets are illuminated. The curvature of the reflective optics typically leads to a projection optics box (POB) design that manipulates light in the form of an illuminated curved slit.

The small CD and nanometer-scale EUV light wavelength calls for high accuracy and stability of the EUV mirror focus. For example, small aberrations such as a Z9 (spherical) aberration can lead to defocusing of an EUV mirror (and consequent defocusing of the optical image on the wafer) that is sufficient to degrade semiconductor device performance and/or yield. The optical stability of an EUV mirror is also temperature-dependent. Accordingly, the EUV POB is typically kept at a target temperature near room temperature (e.g. 22° C.).

Disclosed herein are approaches for providing enhanced optical stability in an EUV mirror. The approaches employ a heated EUV mirror, and are based on the recognition herein that precise control of the temperature of the EUV mirror substantially improves optical stability of the EUV mirror, especially with respect to suppression of optical aberrations and maintaining focusing stability. It is recognized herein that achievement of sufficient temperature stability may not be attainable using approaches that control the temperature of the surrounding environment (e.g. controlling the temperature of the cleanroom housing the EUV lithography scanner, or controlling the temperature of the vacuum chamber of the POB). In various embodiments, approaches for implementing feedback controlled temperature of a EUV mirror in the challenging environment of a POB are described. Still further, some nonlimiting illustrative embodiments for constructing a suitable heated EUV mirror are described herein.

With reference to FIG. 1, a projection optics box (POB) 10 of an EUV lithography scanner is diagrammatically shown, along with diagrammatically shown contextual components including a reticle stage 12 for holding an EUV photolithography mask or reticle 14 and a wafer stage 16 for holding a semiconductor wafer 18. The POB 10 includes a vacuum chamber 20 containing a set of EUV-reflective mirrors, labeled (without loss of generality) in FIG. 1 as EUV-reflective mirror M1, EUV-reflective mirror M2, EUV-reflective mirror M3, EUV-reflective mirror M4, EUV-reflective mirror M5, and EUV-reflective mirror M6. The plurality of EUV-reflective mirrors M1, M2, M3, M4, M5, and M6 form an optical train arranged respective to the reticle stage 12 and the wafer stage 16 to project an image of the reflective EUV photolithography mask 14 disposed on the reticle stage 12 onto the wafer 18 disposed on the wafer stage 16. Although not shown in detail in FIG. 1, each of the EUV mirrors M1, M2, M3, M4, M5, and M6 includes a mirror support and an EUV-reflective multilayer disposed on a front side of the mirror support. The EUV-reflective multilayer forms a distributed Bragg reflector that is tuned to provide reflection of a design-basis EUV wavelength by constructive interference. As is known in the art, such tuning is readily obtained by optical modeling to design the thicknesses of the constituent layers of the reflective multilayer, with the optical modeling taking into account the refractive indices of the constituent layers, and/or by forming and testing the reflective multilayer with a range of thicknesses of the constituent layers to empirically design and/or optimize the thicknesses to provide maximum reflectance at the design-basis EUV wavelength. By way of nonlimiting illustrative example, in the case of the design-basis EUV wavelength being 13.5 nm, the EUV-reflective multilayer can suitably comprise a molybdenum/silicon (Mo/Si) multilayer with suitably tuned thicknesses for the alternating Mo and Si constituent layers.

In operation, EUV light L1 is input to the POB 20 from a laser-produced plasma (LPP) EUV light source (not shown). As a nonlimiting illustrative example, the LPP light source may employ a tin plasma for producing illustrative design-basis 13.5 nm EUV light. The LPP light source is arranged respective to the POB 20 to direct the input light L1 onto the EUV photolithography mask or reticle 14 disposed on the EUV reticle stage 12. The EUV photolithography mask or reticle 14 reflects the EUV light L1 to form reflected light L2. The EUV-reflective mirrors M1, M2, M3, M4, M5, and M6 (which for brevity are sometimes referred to herein as EUV mirrors) form the optical train as EUV mirror M1 reflects the light L2 to form light L3 which is reflected by EUV mirror M2 to form light L4 which is reflected by EUV mirror M3 to form light L5 which is reflected by EUV mirror M4 to form light L6 which is reflected by EUV mirror M5 to form light L7 which is reflected by EUV mirror M6 to form light L8 which is directed onto the wafer 18 disposed on the wafer stage 16. It will be appreciated that the specific illustrated optical train comprising EUV mirrors M1, M2, M3, M4, M5, and M6 is merely a nonlimiting illustrative example, and that in a specific POB design the number of EUV mirrors may be greater than or less than the illustrative six EUV mirrors and/or that the specific arrangement of the EUV mirrors forming the optical train can be different than that shown in FIG. 1. It will be further appreciated that in addition to redirecting (i.e. reflecting) the EUV light, the various EUV mirrors may also variously shape the EUV light beam. For example, FIG. 1 provides a nonlimiting illustrative example in which the mirror M4 is a focusing mirror which focuses the light L6 to a focal point 22, and the combination of mirrors M5 and M6 are positioned such that the optical path from the focal point 22 to the wafer 18 is effective to form an image of the EUV photolithography mask or reticle 14 on the semiconductor wafer 18.

It is to be understood that the POB 10 is diagrammatically shown in FIGURE 10, and that various additional components known in the art are omitted, such as motorized X-Y translation mechanisms of the wafer stage 16 and EUV reticle stage 12 for translating scanning the image of the EUV photolithography mask or reticle 14 across the wafer 18, the aforementioned LPP light source, vacuum-tight optical coupling between the LPP light source and the POB 10, suitable vacuum pumps, and the like.

The POB 10 is suitably used in a method of manufacturing an integrated circuit. In such a method, a photoresist layer is disposed on the semiconductor wafer 18. The photoresist layer on the semiconductor wafer is exposed to EUV light using the POB 10 of the EUV lithography scanner. After the exposing, the photoresist layer is developed to form openings in the photoresist layer. After the developing, at least one wafer processing operation is performed on the semiconductor wafer through the openings in the photoresist layer. The at least one wafer processing operation may include, by way of some nonlimiting illustrative examples: depositing material on areas of the semiconductor wafer exposed by the openings in the photoresist layer; etching areas of the semiconductor wafer exposed by the openings in the photoresist layer; performing ion implantation into areas of the semiconductor wafer exposed by the openings in the photoresist layer; various combinations thereof; and/or so forth. It will be appreciated that the at least one wafer processing operation is typically a portion of an integrated circuit (IC) manufacturing workflow that may include many additional wafer processing operations performed before and/or after the at least one wafer processing operation that is performed on the semiconductor wafer through the openings in the photoresist layer.

In such IC manufacturing, to achieve projection of the image of the EUV photolithography mask or reticle 14 on the wafer 18 during the EUV exposure with sufficient optical stability to reproducibly define features of small critical dimension (CD) in a photoresist disposed on the wafer 18 (for example, features with CD on the order of nanometers or smaller in some embodiments), the optical properties of the EUV mirrors M1, M2, M3, M4, M5, and M6 of the POB 10 should exhibit a high degree of optical stability over time. To achieve this, various measures may be taken. For example, the mirror supports of the EUV mirrors M1, M2, M3, M4, M5, and M6 may be made of a material with low coefficient of thermal expansion. Additionally, the cleanroom housing the EUV lithography scanner including the POB 10 may be temperature controlled so that the ambient temperature of the cleanroom is maintained at a fixed design-basis temperature.

However, as recognized herein, these measures for maintaining optical stability of the EUV mirrors of the POB 10 may be insufficient to attain the desired optical stability for achieving reproducible definition of small CD features in photoresist disposed on the surface of the wafer 10. To further enhance optical stability, at least one EUV mirror may be a heated EUV mirror. In FIG. 1, the EUV mirror M5 is an illustrative heated EUV mirror; however, this is merely a nonlimiting illustrative example and more generally any one, two, three, more, or all of the EUV mirrors M1, M2, M3, M4, M5, and M6 making up the optical train of the POB 10 may be a heated EUV mirror as disclosed herein. In this way, during the method of manufacturing of the IC, the exposing step may include controlling a temperature of an EUV mirror of the POB 10 (e.g., controlling the temperature of illustrative EUV mirror M5 in the example of FIG. 1) using a heater 34 embedded in the EUV mirror M5.

Inset A of FIG. 1 diagrammatically shows a simplified side sectional view of the illustrative heated EUV mirror M5. As seen in Inset A, the heated EUV mirror M5 includes a mirror support 30, an EUV-reflective multilayer 32 disposed on a front side of the mirror support 30, and a resistive heater 34 disposed in the mirror support 30. Optionally, a back cover 36 may be disposed on a back side of the mirror support 30 of the heated EUV mirror M5. The back side of the mirror support 30 is opposite the front side of the mirror support 30 of the heated EUV mirror M5. A plenum 38 is defined or disposed between the back side of the mirror support 30 of the heated EUV mirror M5 and the back cover 36. Gas inlet and outlet connectors 40 and 42 (e.g., illustrative gas inlet 40 and gas outlet 42) are configured to flow a gas through the plenum 38. The gas flowed through the plenum 38 via the gas inlet and outlet connectors 40 and 42 may, for example, be air, clean dry air (CDA), extreme clean dry air (XCDA), nitrogen ($N_2$) gas, or so forth. In one nonlimiting illustrative embodiment, the gas is air (or CDA, or XCDA, or in variant embodiments $N_2$ or so forth) supplied to the plenum 38 to maintain an air pressure of 150 Pa or lower (corresponding to about 0.0015 Atm or lower, or 1.125 Torr or lower). As further diagrammatically shown in Inset A of FIG. 1, the front side of the mirror support 30 of the heated EUV mirror M5 may be curved, for example to achieve a desired focusing or divergence of the light. In this case, the EUV-reflective multilayer 32 of the heated EUV mirror M5 is curved conformally with curved front side of the mirror support 30.

As further diagrammatically shown in the main drawing of FIG. 1, the heated EUV mirror M5 is part of an EUV mirror system that further includes a temperature sensor 44 arranged to measure a temperature of the heated EUV mirror M5, and a feedback temperature controller 46 connected to receive a measured temperature value from the temperature sensor 44 and to deliver electrical power to the resistive heater 34 to generate heat. The feedback temperature controller 46 is configured to control the delivered electrical power to maintain the measured temperature value at a setpoint temperature. For example, the setpoint temperature may be a temperature that is about room temperature, e.g. a setpoint temperature in a range of 20° C. to 24° C. in some embodiments. In one nonlimiting illustrative example, the setpoint temperature may be 22.0° C. In some examples, the setpoint temperature may be chosen to be equal to the temperature of the cleanroom containing the POB 10.

The temperature sensor 44 may, in some embodiments, comprise an optical temperature sensor such as an optical pyrometer or an infrared temperature sensor arranged to view the mirror support 30 and/or the EUV-reflective multilayer 32. Depending on the operating wavelength of such an optical sensor, the measured temperature value may be the temperature of the mirror support 30, or of the EUV-reflective multilayer 32, or of the combination of the mirror support 30 and the EUV-reflective multilayer 32. In any case, it is expected that the temperature of the mirror support 30 and the temperature of the EUV-reflective multilayer 32 will be close to identical, so that the measured temperature value is in any of these cases representative of a temperature of the heated EUV mirror M5. Using an optical temperature sensor as the temperature sensor 44 is advantageous since it does not involve contacting the heated EUV mirror M5; however, in other embodiments it is alternatively contemplated to employ a contacting temperature sensor such as a thermocouple that is attached to the heated EUV mirror M5.

The feedback temperature controller 46 may be variously configured to control the delivered electrical power to maintain the measured temperature value at a setpoint temperature. For example, in an embodiment in which the controller 46 is a digital proportional-integral-differential (PID) controller, the proportional, integral, and differential coefficients may be set in software to provide suitably responsive temperature control without excessive overshoot or undershoot. In in an embodiment in which the controller 46 is an analog PID controller, the proportional, integral, and differential coefficients may be similarly set by manual or electrical inputs to provide such responsive temperature control without excessive overshoot or undershoot. These are merely nonlimiting illustrative examples.

It will be further appreciated that temperature control can be achieved by balancing heating provided by the resistive heater 34 driven by the feedback temperature controller 46 against cooling or heat removal provided by air, CDA, XCDA, $N_2$, or other gas flowing through the plenum 38 via the gas inlet and outlet connectors 40 and 42. For example, the gas flow by itself may be chosen to produce a steady state temperature that is below the setpoint temperature of the controller 46, and the resistive heater 34 driven by the feedback temperature controller 46 then operates to raise this base temperature to the setpoint temperature. This approach can provide more precise temperature control, especially if the setpoint temperature is close to or below the ambient temperature of the cleanroom.

Figure 2:
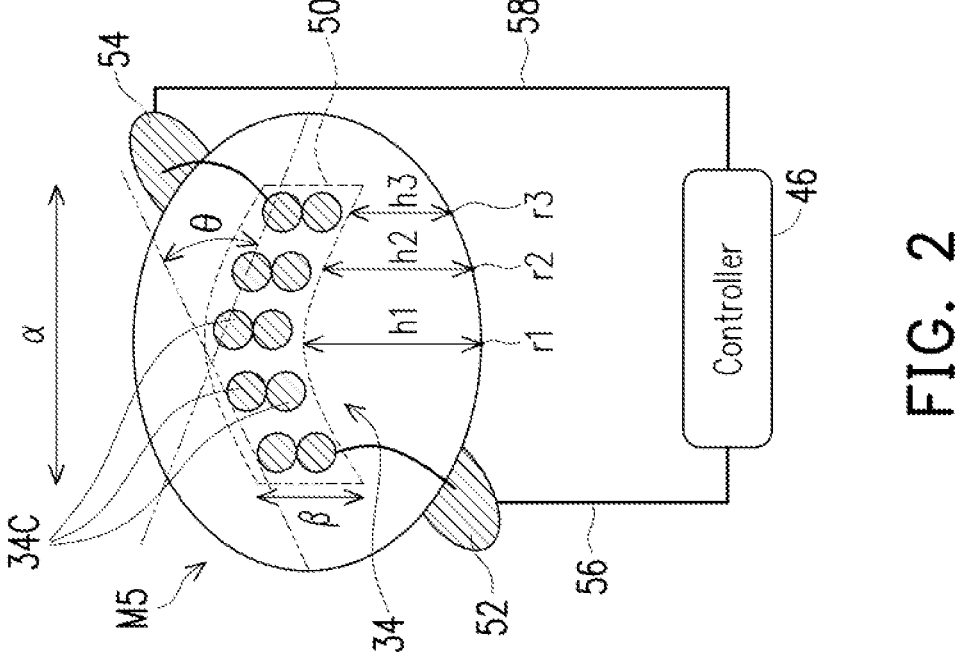
FIG. 2 diagrammatically illustrates a perspective view of an EUV-reflective mirror system.

With reference to FIG. 2, a diagrammatic perspective view of the heated EUV mirror M5 is shown, which includes the heater 34 covering an area 50 of the surface of the heated EUV mirror M5. FIG. 2 also shows the feedback temperature controller 46, and electrical connectors 52 and 54 via which corresponding electrical wires, cables, or the like 56 and 58 connect the controller 46 to the heater 34.

Figure 3:
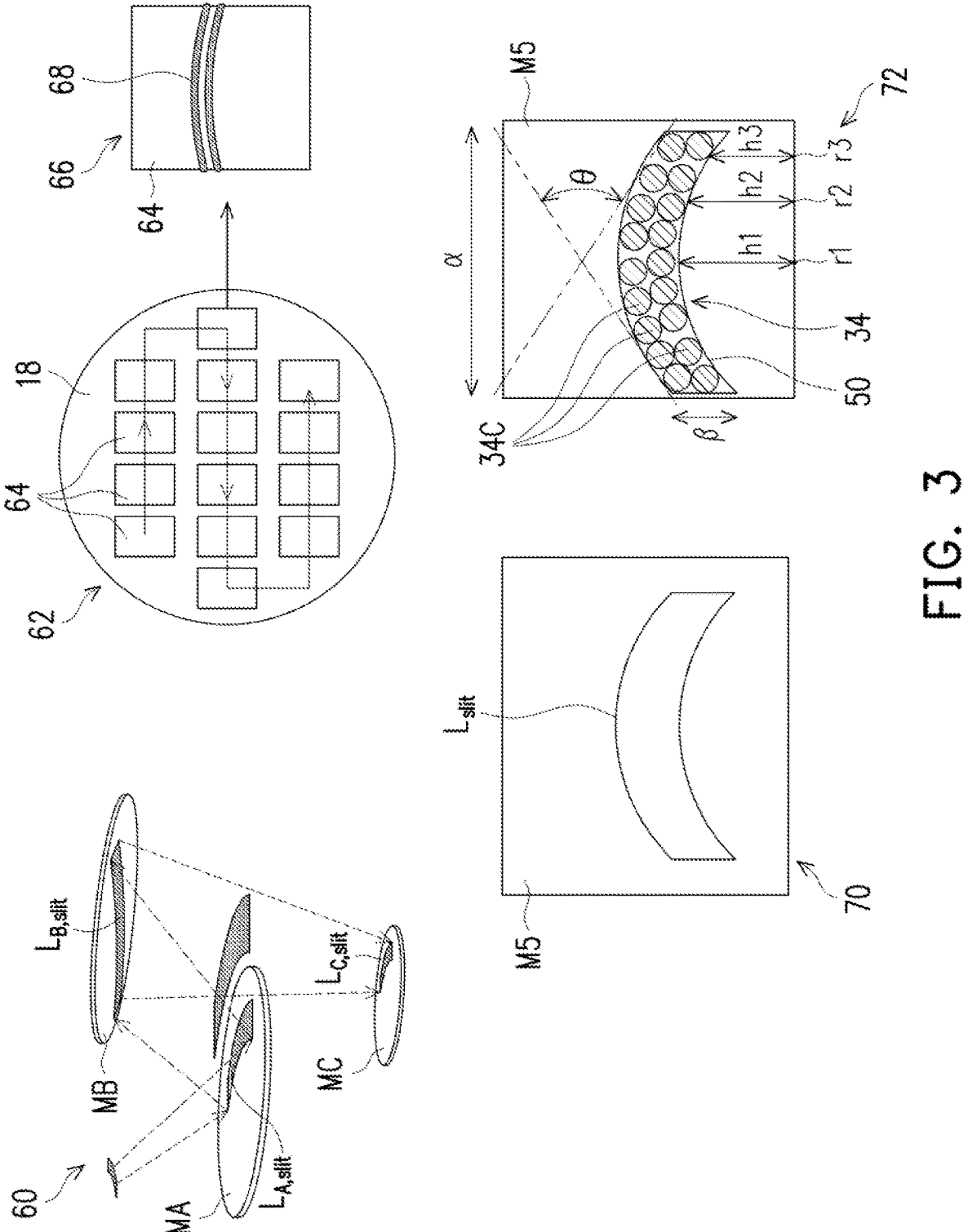
FIG. 3 diagrammatically illustrates design of a heater of an EUV-reflective mirror system to match an illumination slit of a typical EUV lithography scanner.

With continuing reference to FIG. 2 and with further reference to FIG. 3, In some embodiments the EUV mirrors of the POB have curvature that manipulates the EUV light in the form of an illuminated curved slit, and the area 50 of the resistive heater 34 of the heated EUV mirror M5 comprises a curved slit area 50 that is sized and shaped to match the illumination slit on the mirror M5. Drawing 60 of FIG. 3 diagrammatically illustrates a portion of an optical train of a POB including three EUV mirrors MA, MB, and MC (which could be, for example, a subset of three of the six mirrors M1, M2, M3, M4, M5, M6 of the POB 10 of FIG. 1), showing the slit illumination $L_{A,slit}$, $L_{B,slit}$, and $L_{C,slit}$ on each respective mirror EUV mirror MA, MB, and MC.

Drawing 62 of FIG. 2 illustrates how the EUV lithography scanner including the POB 10 may employ a step-and-shoot to illuminate each field facet 64 on the semiconductor wafer 18. To do so, with reference back to FIG. 1 in some EUV lithography scanner designs motorized X-Y translation mechanisms of the wafer stage 16 and EUV reticle stage 12 move the wafer 18 and photolithography mask or reticle 14 respectively to obtain successive illumination of the successive field facets 64 on the wafer 18. In this way, the EUV mirrors M1, M2, M3, M4, M5, M6 of the POB 10 can remain stationary while the illumination slit moves from one field facet to the next field facet, and as shown in drawing 66 of FIG. 3 the illumination slit 68 sweeps across each field facet 64.

Returning to the illustrative heated EUV mirror M5 of FIGS. 1 and 2, drawing 70 of FIG. 3 diagrammatically shows a portion of the heated EUV mirror M5 with the area of the EUV illumination $L_{slit}$ on the front EUV-reflective surface of the mirror M5 indicated. The EUV-reflective front surface of the heated EUV mirror M5 may in general be curved in a convex or concave shape, depending on the intended optical function (e.g., focusing, magnification, et cetera) of the mirror M5. As explained with reference to drawings 60, 62, and 66 of FIG. 3, the illuminated area $L_{slit}$ on the heated EUV mirror M5 typically forms an illuminated slit $L_{slit}$ on the mirror M5. With reference to drawing 72 of FIG. 3, the area 50 of the heater 34 preferably conforms with the illuminated slit area $L_{slit}$. This provides the advantage of reduced thermal input into the POB 10 to maintain the setpoint temperature of the heated EUV-reflective mirror M5, since the heat is precisely directed to the illuminated area $L_{slit}$.

With particular reference to FIG. 2 and drawing 72 of FIG. 3, in some embodiments, the angle θ indicated in FIG. 3 drawing 72 is greater than zero degrees (i.e., θ>0°). In some embodiments, the curved slit area 50 spanned by the resistive heater 34 has a slit width β of at least two millimeters (i.e. β≥2 mm) and the curved slit area has a slit length α of at least two millimeters (i.e. α≥2 mm). In some embodiments, $\alpha \geq \beta$. In some embodiments, the distances h1, h2, and h3 at respective radial locations r1, r2, and r3 indicated in drawing 72 meet the condition h1>h2>h3. The total area of the heated EUV mirror M5 can be any size that is larger than the illuminated area $L_{slit}$. For example, in one nonlimiting illustrative example the heated EUV mirror M5 is a circular mirror with a radius of 300 mm±0.01 mm.

With continuing reference to FIG. 2 and drawing 72 of FIG. 3, in some embodiments the resistive heater 34 comprises a plurality of heater spots or coils 34C that fill the curved slit area 50. The heater spots or coils 34C may for example comprise copper, copper alloy, aluminum, aluminum alloy, or another metal foil or deposited metal layer whose thickness and resistivity is effective to provide the desired resistive heating. The heater spots or coils 34C are electrically interconnected in series, in parallel, or in series-parallel combinations to the electrical connectors 52 and 54 so that the temperature controller 46 delivers electric current to the heater spots or coils 34C. This design employing the heater spots or coils 34C advantageously enables the heating to be spread out uniformly over the curved slit area 50. It should be noted that while the curved slit area 50 of the resistive heater 34 is chosen to match the illuminated slit $L_{slit}$ on the mirror M5 (compare drawings 70 and 72 of FIG. 3), the curved slit area 50 of the resistive heater 34 may not be precisely equal to the illuminated slit $L_{slit}$. For example, it may be advantageous for the curved slit area 50 of the resistive heater 34 to be slightly larger than the illuminated slit $L_{slit}$ on the mirror M5 to ensure uniform heat distribution over the entire illuminated slit $L_{slit}$.

Figure 4:
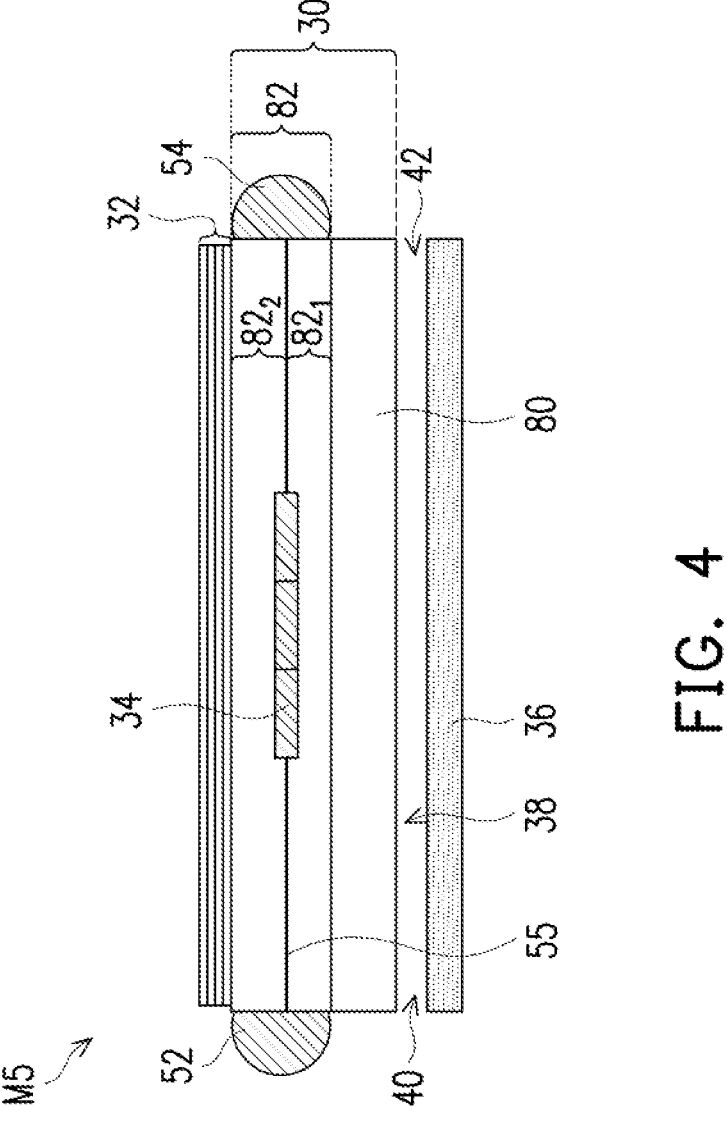
FIG. 4 diagrammatically illustrates a side sectional view of an EUV-reflective mirror including a heater as disclosed herein.

With reference to FIG. 4, the heated EUV mirror M5 is diagrammatically illustrated as a side sectional view according to one nonlimiting illustrative embodiment. As previously discussed, the heated EUV mirror M5 includes the mirror support 30 and the EUV-reflective multilayer 32 disposed on the front side of the mirror support 30. In some nonlimiting illustrative embodiments the EUV-reflective multilayer 32 comprises a molybdenum/silicon (Mo/Si) multilayer 32. More generally, the EUV-reflective multilayer 32 forms a distributed Bragg reflector that is tuned to provide reflection of a design-basis EUV wavelength by constructive interference. The embodiment of the heated EUV mirror M5 shown in FIG. 4 further includes the resistive heater 34, the back cover 36 disposed on the back side of the mirror support 30, and the plenum 38 defined therebetween with gas inlet 40 and gas outlet 42, as previously described. The side sectional view of FIG. 4 also shows electrical traces 55 that connect the electrical connectors 52 and 54 to the resistive heater 34. It is noted that while diagrammatic FIG. 4 depicts the heated EUV mirror M5 as flat, more generally the front side of the mirror support 30 may be curved (either convex or concave, depending on the optical purpose of the EUV mirror M5), and likewise the EUV-reflective multilayer 32 may be curved conform ally with curved front side of the mirror support 30.

The side sectional view of FIG. 4 further illustrates one suitable construction of the mirror support 30. In this illustrative construction, the mirror support 30 includes a mirror substrate 80, and a dielectric or ceramic layer 82 disposed on the mirror substrate 80. In this construction, the mirror substrate 80 provides structural rigidity and support for the heated EUV mirror M5, and may for example comprise a quartz substrate, a silicon substrate, a copper or copper alloy substrate, or an aluminum or aluminum alloy substrate, or so forth. In one nonlimiting illustrative embodiment, the mirror substrate 80 may be a precipitation-hardened copper or aluminum alloy. The EUV-reflective multilayer 32 is disposed on the dielectric or ceramic layer 82. The resistive heater 34 is embedded in the dielectric or ceramic layer 82 (as shown), or in an alternative embodiment (not shown) the resistive heater 34 may be disposed between the mirror substrate and the dielectric or ceramic layer, e.g. deposited on the mirror substrate 80 prior to formation of the dielectric or ceramic layer 82. The dielectric or ceramic layer 82 provides electrical insulation for the resistive heater 34 and electrically conductive traces 55, and also should have sufficient thermal conductivity for heat generated by the resistive heater 34 to propagate through the dielectric or ceramic layer 82, and to the EUV-reflective multilayer 32. For example, the dielectric or ceramic layer 82 may comprise a dielectric or ceramic material with high thermal conductivity and low electrical conductivity.

To fabricate the illustrative mirror support 30 in which the resistive heater 34 is embedded in the dielectric or ceramic layer 82, in some embodiments the dielectric or ceramic layer 82 is formed as two layers $82_1$ and $82_2$. In this approach, the first dielectric or ceramic layer $82_1$ is first deposited on the mirror substrate 80. Thereafter, the metal foil or film forming the resistive heater 34 and electrically conductive traces 55 are deposited or otherwise formed and patterned. Next, the second dielectric or ceramic layer $82_2$ is deposited on the first dielectric or ceramic layer $82_1$ and the patterned metal components 34 and 55, and finally the EUV-reflective multilayer 32 is deposited on the second dielectric or ceramic layer $82_2$. The thickness of the second dielectric or ceramic layer $82_2$ is chosen to provide a suitable buffer between the EUV-reflective multilayer 32 and the resistive heater 34 while being thin enough for efficient heat transfer from the resistive heater 34 to the EUV-reflective multilayer 32. Typically, the first dielectric or ceramic layer $82_1$ and the second dielectric or ceramic layer $82_2$ comprise the same material; however, this in not required. In some embodiments it is contemplated for the second dielectric or ceramic layer $82_2$ to be a different material than the first dielectric or ceramic layer $82_1$.

In a variant embodiment (not shown), if the resistive heater 34 and electrically conductive traces 55 are formed on the surface of the mirror substrate 80, then the dielectric or ceramic layer 82 can be deposited as a single layer on top of the mirror substrate 80 and the patterned metal components 34 and 55. In such embodiments, the mirror substrate 80 should be made of an electrically insulating material.

Figure 5:
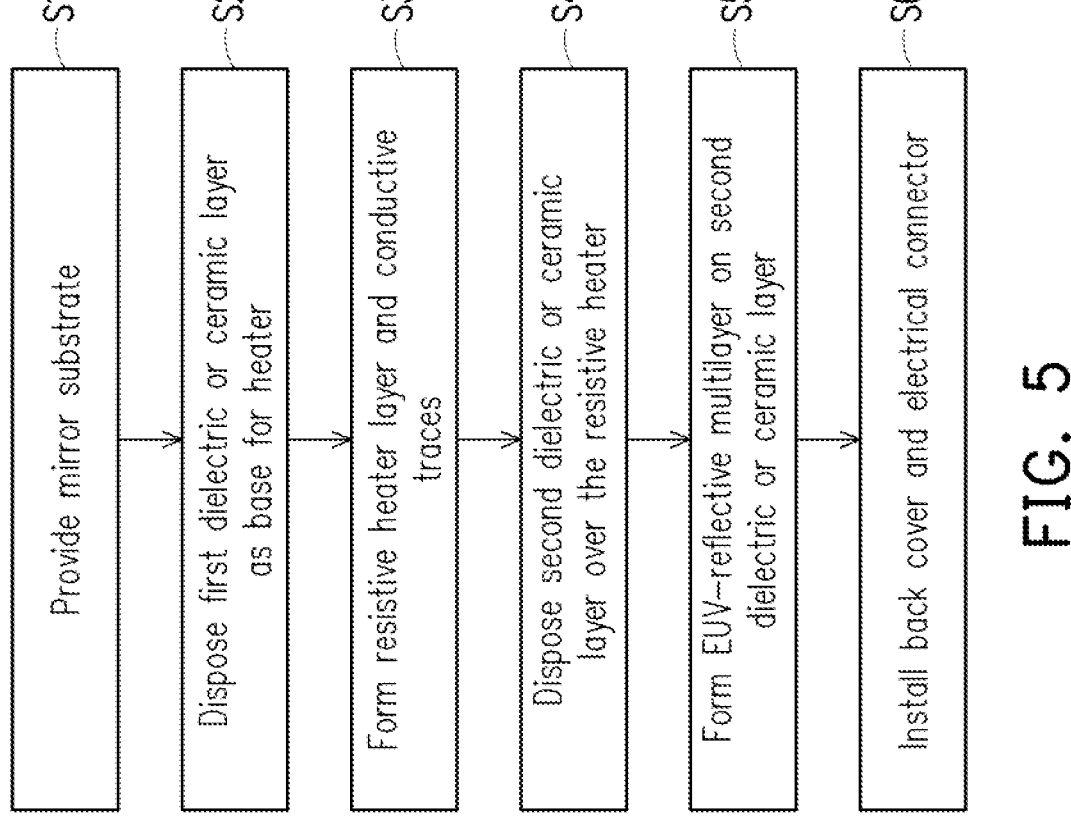
FIG. 5 presents a flow chart of a fabrication process for fabricating an EUV-reflective mirror including a heater.

With reference to FIG. 5, a suitable method of manufacturing a heated EUV mirror with the structure shown in FIG. 4 is presented by way of a flowchart. In an operation S1, the mirror substrate 80 is provided. The provided mirror substrate 80 should be optically smooth, and its front surface may optionally be mechanically polished, chemical mechanically polished (CMP), or otherwise treated. In an operation S2, the first dielectric or ceramic layer $82_1$ is formed on the surface of the mirror substrate 80 to form a base for the resistive heater. This deposition can employ any material deposition technique suitable for the type of dielectric or ceramic material being deposited. For example, the deposition operation S2 may employ chemical vapor deposition (CVD), sputter deposition, vacuum evaporation deposition, or so forth. Optionally, the operation S2 can include a further smoothing operation such as mechanical polishing, CMP, or the like to provide a suitably smooth surface for the subsequent deposition operations.

In an operation S3, the resistive heater 34 and electrically conductive traces 55 are formed. This can be done by various techniques depending on the material of the resistive heater 34 and electrically conductive traces 55, such as by deposition of a uniform metal layer followed by photolithographically controlled etching to remove the metal layer except for those portions forming the heater spots or coils 34C filling the curved slit area 50 and the electrically conductive traces 55. Various deposition techniques such as CVD, sputter deposition, vacuum evaporation deposition, electroplating, or so forth. Typically, the resistive heater 34 and electrically conductive traces 55 are made of the same material for manufacturing convenience, although this is not necessary. The thickness of the initially deposited uniform metal layer and the feature sizes of the heater spots or coils 34C are chosen (along with the resistivity of the constituent material) to provide the suitable electrical resistance to achieve the desired resistive heating when operating the completed resistive heater 34.

In an operation S4, the second dielectric or ceramic layer 82₂ is disposed over the first dielectric or ceramic layer 82₁ and the patterned metal components 34 and 55. This deposition S4 can employ any material deposition technique suitable for the type of dielectric or ceramic material being deposited, such as CVD, sputter deposition, vacuum evaporation deposition, or so forth. In some embodiments in which the first and second dielectric or ceramic layers 82₁ and 82₂ are made of the same material, the operations S2 and S4 can employ the same deposition technique. Optionally, the operation S4 can include a further smoothing operation such as mechanical polishing, CMP, or the like to provide a suitably smooth surface for the subsequent deposition of the EUV-reflective multilayer 32.

In an operation S5, the EUV-reflective multilayer 32 is formed on the second dielectric or ceramic layer 82₂. This can employ any type of multilayer deposition technique that is suitable for forming the alternating layers of the EUV-reflective multilayer 32. By way of nonlimiting illustrative example, if the EUV-reflective multilayer 32 is a molybdenum/silicon (Mo/Si) multilayer then some suitable deposition techniques include ion beam sputter deposition, plasma ion assisted deposition, or so forth. The thicknesses of the constituent layers (e.g. the Mo and Si layers) and the number of periods of the EUV-reflective multilayer 32 are chosen to provide the desired distributed Bragg reflector tuned to provide reflection of the design-basis EUV wavelength by constructive interference.

In an operation S6, the heated EUV mirror assembly is completed by installing the back cover 36 and the electrical connectors 52 and 54, with the latter soldered, wire bonded, or otherwise electrically connected to the electrically conductive traces 55. The operation S6 may optionally include other operations such as installing gas couplers at the gas inlet 40 and gas outlet 42, mounting the assembly in a mirror holder or mount (not shown), and/or so forth.

It is to be appreciated that the illustrative embodiments described with reference to FIG. 4 and manufacturing methods described with reference to FIG. 5 are merely examples, and that other designs and manufacturing methods can be employed for constructing the heated EUV mirror M5 with mirror support 30, EUV-reflective multilayer 32 disposed on a front side of the mirror support, and the resistive heater 34 disposed in the mirror support 30.

In the following, some further embodiments are described.

In a nonlimiting illustrative embodiment, a projection optics box (POB) of an extreme ultraviolet (EUV) lithography scanner is disclosed. The POB includes a vacuum chamber, and a plurality of EUV mirrors disposed inside the vacuum chamber and arranged respective to a reticle stage and a wafer stage to project an image of a reflective EUV photolithography mask disposed on the reticle stage onto a wafer disposed on the wafer stage. Each EUV mirror of the plurality of EUV mirrors includes a mirror support and an EUV-reflective multilayer disposed on a front side of the mirror support. The plurality of EUV mirrors includes at least one heated EUV mirror that further includes a resistive heater disposed in the mirror support of the heated EUV mirror.

In a nonlimiting illustrative embodiment, an EUV mirror system includes a mirror support, an EUV-reflective multilayer disposed on a front side of the mirror support, and a resistive heater disposed in the mirror support.

In a nonlimiting illustrative embodiment, a method is disclosed of manufacturing an EUV mirror. The method includes: disposing a first dielectric or ceramic layer on a front side of a mirror substrate; forming a resistive heater and electrically conductive traces on the first dielectric or ceramic layer; disposing a second dielectric or ceramic layer over the resistive heater; and forming an EUV-reflective multilayer on the second dielectric or ceramic layer.

In a nonlimiting illustrative embodiment, a method of manufacturing an integrated circuit is disclosed. The method includes: disposing a photoresist layer on a semiconductor wafer; exposing the photoresist layer on the semiconductor wafer to extreme ultraviolet (EUV) light using a projection optics box (POB) of an EUV lithography scanner; after the exposing, developing the photoresist layer to form openings in the photoresist layer; and after the developing, performing at least one wafer processing operation on the semiconductor wafer through the openings in the photoresist layer. The exposing includes controlling a temperature of an EUV mirror of the POB using a heater embedded in the EUV mirror. In some such embodiments, the EUV mirror includes a mirror support, an EUV-reflective multilayer disposed on a front side of the mirror support, and a resistive heater disposed in the mirror support, and the controlling of the temperature of the EUV mirror includes: measuring a temperature of the EUV mirror using a temperature sensor; and delivering electrical power to the resistive heater, including performing feedback control of the delivering to maintain the measured temperature at a setpoint temperature. In some embodiments the controlling of the temperature of the EUV mirror further includes cooling the EUV mirror by flowing gas through a plenum of the EUV mirror.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A projection optics box (POB) of an extreme ultraviolet (EUV) lithography scanner, the POB comprising:
   a vacuum chamber; and
   a plurality of EUV mirrors disposed inside the vacuum chamber and arranged respective to a reticle stage and a wafer stage to project an image of a reflective EUV photolithography mask disposed on the reticle stage onto a wafer disposed on the wafer stage, each EUV mirror of the plurality of EUV mirrors including a mirror support and an EUV-reflective multilayer disposed on a front side of the mirror support;

wherein the plurality of EUV mirrors includes at least one heated EUV mirror that further includes a resistive heater, the mirror support of each heated EUV mirror including a mirror substrate and a dielectric or ceramic layer disposed on the mirror substrate, the EUV-reflective multilayer being disposed on the dielectric or ceramic layer, and wherein the resistive heater of each heated EUV mirror is embedded in the dielectric or ceramic layer of the heated EUV mirror.

2. The POB of claim 1, wherein:

the front side of the mirror support of the heated EUV mirror is curved and the EUV-reflective multilayer of the heated EUV mirror is curved conformally with the curved front side of the mirror support; and an area of the resistive heater of the heated EUV mirror comprises a curved slit area.

3. The POB of claim 2, wherein the resistive heater of the heated EUV mirror comprises a plurality of resistive heater spots or coils filling the curved slit area.

4. The POB of claim 1, wherein:

the resistive heater of the heated EUV mirror is not disposed between the mirror substrate and the dielectric or ceramic layer.

5. The POB of claim 1, wherein the heated EUV mirror further includes:

a back cover disposed on a back side of the mirror support of the heated EUV mirror opposite the front side of the mirror support of the heated EUV mirror, a plenum being disposed between the back side of the mirror support of the heated EUV mirror and the back cover; and gas inlet and outlet connectors configured to flow a gas through the plenum.

6. The POB of claim 1, further comprising:

a feedback control system corresponding to each heated EUV mirror, the feedback control system including:

a temperature sensor arranged to measure a temperature of the heated EUV mirror; and a feedback temperature controller connected to receive a measured temperature value from the temperature sensor and to deliver electrical power to the resistive heater of the heated EUV mirror to generate heat, the feedback temperature controller configured to control the electrical power delivered to the heated EUV mirror to maintain the measured temperature value at a setpoint temperature.

7. An extreme ultraviolet (EUV) mirror system comprising:

a projection optics box (POB) that comprises:

a vacuum chamber; and a plurality of EUV mirrors disposed inside the vacuum chamber and arranged respective to a reticle stage and a wafer stage to project an image of a reflective EUV photolithography mask disposed on the reticle stage onto a wafer disposed on the wafer stage, each EUV mirror of the plurality of EUV mirrors including a mirror support and an EUV-reflective multilayer disposed on a front side of the mirror support;

wherein the plurality of EUV mirrors includes at least one heated EUV mirror that further includes a resistive heater, the mirror support of each heated EUV mirror including a mirror substrate and a dielectric or ceramic layer disposed on the mirror substrate, the EUV-reflective multilayer being disposed on the dielectric or ceramic layer, and wherein the resistive heater of each heated EUV mirror is embedded in the dielectric or ceramic layer of the heated EUV mirror.

8. The EUV mirror system of claim 7, wherein an area of the resistive heater comprises a curved slit area.

9. The EUV mirror system of claim 8, wherein the front side of the mirror support of the at least one heated EUV mirror is curved and the EUV-reflective multilayer of the at least one heated EUV mirror is curved conformally with the curved front side of the mirror support.

10. The EUV mirror system of claim 8, wherein the resistive heater of the at least one heated EUV mirror comprises a plurality of resistive heater spots or coils filling the curved slit area.

11. The EUV mirror system of claim 7, wherein the resistive heater of the at least one heated EUV mirror is not disposed between the mirror substrate and the dielectric or ceramic layer.

12. The EUV mirror system of claim 11, wherein the mirror substrate is a quartz substrate, a silicon substrate, a copper or copper alloy substrate, or an aluminum or aluminum alloy substrate.

13. The EUV mirror system of claim 7, further comprising:

a back cover disposed on a back side of the mirror support opposite the front side of the mirror support, a plenum being disposed between the back side of the mirror support and the back cover; and gas inlet and outlet connectors configured to flow a gas through the plenum.

14. The EUV mirror system of claim 7, further comprising:

a temperature sensor arranged to measure a temperature of the mirror support and/or the EUV-reflective multilayer; and a feedback temperature controller connected to receive a measured temperature value from the temperature sensor and to deliver the electrical power to the resistive heater to generate heat;

wherein the feedback temperature controller is configured to control the delivered electrical power to maintain the measured temperature value at a setpoint temperature.

15. The EUV mirror system of claim 14, wherein the temperature sensor comprises a pyrometer or an infrared temperature sensor arranged to view the mirror support and/or the EUV-reflective multilayer.

16. The EUV mirror system of claim 7, wherein the EUV-reflective multilayer forms a distributed Bragg reflector that is tuned to provide reflection of a design-basis EUV wavelength by constructive interference.

17. The EUV mirror system of claim 7, wherein the EUV-reflective multilayer comprises a molybdenum/silicon (Mo/Si) multilayer.

18. A method of manufacturing an integrated circuit, the method comprising:

disposing a photoresist layer on a semiconductor wafer;

exposing the photoresist layer on the semiconductor wafer to extreme ultraviolet (EUV) light using a projection optics box (POB) of an EUV lithography scanner;

after the exposing, developing the photoresist layer to form openings in the photoresist layer; and after the developing, performing at least one wafer processing operation on the semiconductor wafer through the openings in the photoresist layer;

wherein the POB comprises:

a vacuum chamber; and a plurality of EUV mirrors disposed inside the vacuum chamber and arranged respective to a reticle stage and a wafer stage to project an image of a reflective EUV photolithography mask disposed on the reticle stage onto a wafer disposed on the wafer stage, each EUV mirror of the plurality of EUV mirrors including a mirror support and an EUV-reflective multi-layer disposed on a front side of the mirror support;

wherein the plurality of EUV mirrors includes at least one heated EUV mirror that further includes a resistive heater, the mirror support of each heated EUV mirror including a mirror substrate and a dielectric or ceramic layer disposed on the mirror substrate, the EUV-reflective multilayer being disposed on the dielectric or ceramic layer, and wherein the resistive heater of each heated EUV mirror is embedded in the dielectric or ceramic layer of the heated EUV mirror;

wherein the exposing includes controlling a temperature of the at least one heated EUV mirror of the POB.

19. The method of claim 18, wherein the controlling of the temperature of the at least one heated EUV mirror includes:

measuring a temperature of the at least one heated EUV mirror using a temperature sensor; and delivering electrical power to the resistive heater, including performing feedback control of the delivering to maintain the measured temperature at a setpoint temperature.

20. The method of claim 18, wherein the controlling of the temperature of the at least one heated EUV mirror further includes:

cooling the at least one heated EUV mirror by flowing gas through a plenum of the at least one heated EUV mirror.

\* \* \* \* \*